(12) United States Patent
Yang et al.

(10) Patent No.: US 10,415,139 B2
(45) Date of Patent: Sep. 17, 2019

(54) COATING APPARATUS

(71) Applicants: BOE TECHNOLOGY GROUP CO., LTD., Beijing (CN); Fuzhou BOE Optoelectronics Technology Co., Ltd., Fuqing, Fuzhou, Fujian (CN)

(72) Inventors: Shanshan Yang, Beijing (CN); Dalin Cui, Beijing (CN)

(73) Assignees: BOE TECHNOLOGY GROUP CO., LTD., Beijing (CN); FUZHOU BOE OPTOELECTRONICS TECHNOLOGY CO., LTD., Fuzhou (CN)

( * ) Notice: Subject to any disclaimer, the term of this patent is extended or adjusted under 35 U.S.C. 154(b) by 0 days.

(21) Appl. No.: 15/954,303

(22) Filed: Apr. 16, 2018

(65) Prior Publication Data

US 2019/0062919 A1    Feb. 28, 2019

(30) Foreign Application Priority Data

Aug. 25, 2017   (CN) .................. 2017 2 1079953 U

(51) Int. Cl.
*C23C 16/46*    (2006.01)
*H01J 37/32*    (2006.01)

(52) U.S. Cl.
CPC ........ *C23C 16/46* (2013.01); *H01J 37/32724* (2013.01); *H01J 2237/3321* (2013.01)

(58) Field of Classification Search
None
See application file for complete search history.

(56) References Cited

U.S. PATENT DOCUMENTS

| | | | | |
|---|---|---|---|---|
| 5,252,807 A | * | 10/1993 | Chizinsky | C23C 16/46 118/724 |
| 5,558,717 A | * | 9/1996 | Zhao | C23C 16/4401 118/715 |
| 2010/0079695 A1 | | 4/2010 | Um et al. | |
| 2011/0126761 A1 | * | 6/2011 | Lee | C01B 33/035 118/719 |

* cited by examiner

*Primary Examiner* — Jethro M. Pence
(74) *Attorney, Agent, or Firm* — Kinney & Lange, P.A.

(57) ABSTRACT

A coating apparatus includes a coating chamber, and a substrate support structure and a heater in the coating chamber. The substrate support structure includes a plurality of support units. The heater includes a heating plate body having a plurality of through holes and heating filling parts each provided in one of the plurality of through holes, and the plurality of support units are received in the plurality of through holes respectively. In each of the plurality of through holes, one of the plurality of support units is located between one of the heating filling parts and an inner wall of the through hole accommodating the one of the heating filling parts, and the heater further includes connection parts each configured to connect one of the heating filling parts with the inner wall of the through holes accommodating the one of the heating filling parts.

13 Claims, 3 Drawing Sheets

A-A

COATING APPARATUS

CROSS-REFERENCE TO RELATED APPLICATION

This application claims priority of the Chinese Patent Application No. 201721079953.7 filed on Aug. 25, 2017 in the State Intellectual Property Office of China, the whole disclosure of which is incorporated herein by reference.

TECHNICAL FIELD

The present disclosure relates to the field of display technologies, and in particular, to a coating apparatus.

BACKGROUND

During manufacturing of a display device, a semiconductor active layer of a TFT (Thin Film Transistor) is generally manufactured by using a CVD (Chemical Vapor Deposition) process. The CVD process is a process where mixed gases containing a material for making a film is used to chemically react on a surface of a heated substrate so as to precipitate and form the film. The CVD process generally includes PECVD (Plasma Enhanced Chemical Vapor Deposition), APCVD (Atmospheric Pressure Chemical Vapor Deposition), LPCVD (Low Pressure Chemical Vapor Deposition) or the like.

With rapid development of the display techniques, requirements for quality of the display device from customers become higher and higher. Thus, the quality of coating a film on a substrate becomes an issue of concern and research in the industry.

SUMMARY

According to an aspect of the present disclosure, there is provided a coating apparatus, comprising:
a coating chamber; and
a substrate support structure and a heater in the coating chamber,
wherein the substrate support structure comprises a plurality of support units;
the heater comprises a heating plate body having a plurality of through holes and heating filling parts each provided in one of the plurality of through holes, the plurality of support units being received in the plurality of through holes respectively;
in each of the plurality of through holes, one of the plurality of support units is located between one of the heating filling parts and an inner wall of the through hole accommodating the one of the heating filling parts; and
the heater further comprises connection parts each configured to connect one of the heating filling parts with the inner wall of the through hole accommodating the one of the heating filling parts.

In some embodiments, a surface at a side of the heating plate body facing towards a substrate and surfaces at a side of the heating filling parts facing towards the substrate are on a same plane.

In some embodiments, each of the plurality of support units is a support cylinder.

In some embodiments, each of the plurality of support units comprises at least two support bars, the at least two support bars being distributed in a circumferential direction of the through hole in which the at least two support bars are located.

In some embodiments, the at least two support bars are uniformly distributed in the circumferential direction of the through hole in which the at least two support bars are located.

In some embodiments, each of the plurality of support units has a guide groove provided in an axial direction of the through hole, and the connection part is slidably fitted into the guide groove.

In some embodiments, each of the plurality of support units is slidably fitted into a corresponding one of the through holes.

In some embodiments, the plurality of through holes are in one-to-one correspondence to the plurality of support units.

In some embodiments, a section of each of the heating filling parts in a direction perpendicular to an axial direction of the through holes has a circular or polygonal shape.

In some embodiments, it further comprising a driving device configured to drive the heater to move in an axial direction of the through holes.

In some embodiments, the driving device comprises a stepping motor or a servo motor.

In some embodiments, the heater includes a resistive heater, an infrared heater or a laser heater.

In some embodiments, the substrate support structure comprises a ceramic substrate support structure or an aluminum substrate support structure.

DETAILED DESCRIPTION OF EMBODIMENTS

Figure 1:
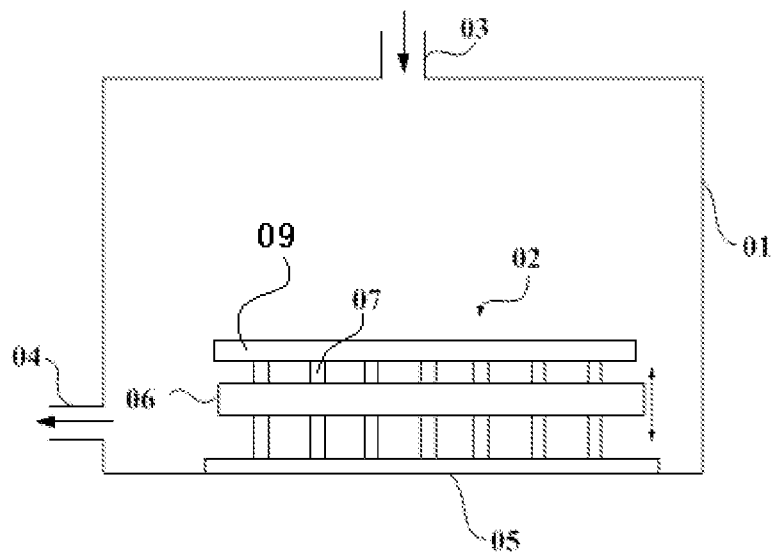
FIG. 1 is a structural schematic diagram of a coating apparatus in related art.
Figure 2:
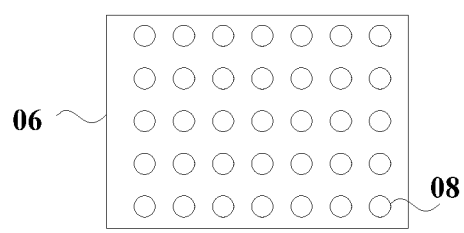
FIG. 2 is a top view of a heating base shown in FIG. 1.

FIG. 1 and FIG. 2, show a coating apparatus for use in a PECVD process. The coating apparatus comprises a coating chamber 01, and a heater 02 disposed in the coating chamber 01. The coating chamber 01 has a feed inlet 03 and an exhaust port 04. The heater 02 includes a pedestal 05, a heating base 06 and support posts 07. The heating base 06 has through holes 08 arranged to correspond to the support posts 07, the heating base 06 is movable up and down relative to the pedestal 05, and the support posts 07 are located within the through holes 08 and extend out of the through holes 08 so as to be fixedly connected with the pedestal 05.

Before coating, the heating base 06 descends, and a substrate 09 is placed on the posts 07 by a robot arm. When coating a film on the substrate 09, the heating base 06 is raised up to be in contact with the substrate 09 so as to heat the substrate 09, while mixed gases are fed from the feed inlet 03, and generate a film on a surface of the heated substrate 09. After completing coating of the film on the substrate 09, the heating base 06 descends, and the substrate 09 is removed out of the coating chamber 01 from the posts 07 by the robot arm.

During coating the film on the substrate 09 by using the above coating apparatus, however, tops of the support posts 07 are in contact with the substrate 09, thus portions of the substrate 09 in contact with the posts 07 could not be heated by the heating base 06, which will result in non-uniform heating of the substrate 09 and thereby a poor coating quality.

In order to at least partly improve the phenomena about non-uniform heating of the substrate 09 during the coating and improve the coating quality, an embodiment of the present disclosure provides a coating apparatus.

In order to make objectives, technical solutions and advantages of the present disclosure clearer, the present disclosure will be further described in detail below in combination with embodiments thereof.

Figure 3:
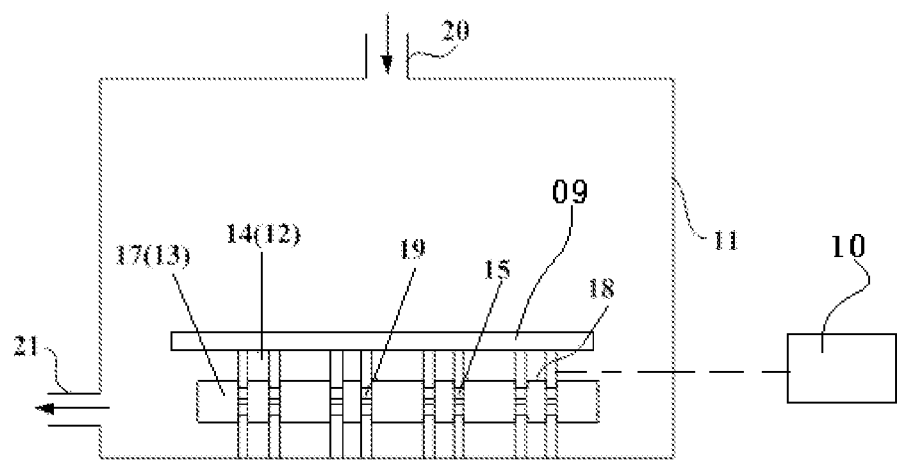
FIG. 3 is a structural schematic diagram of a coating apparatus according to an embodiment of the present disclosure.
Figure 4:
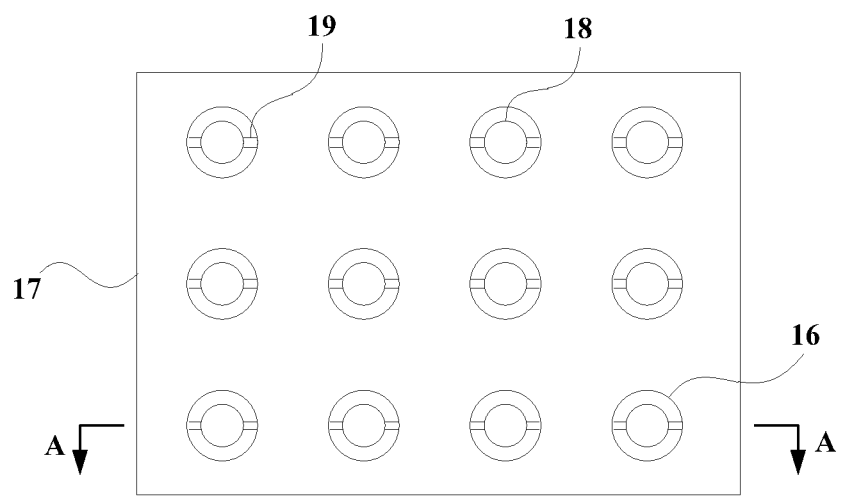
FIG. 4 is a top view of a heater according to an embodiment of the present disclosure.

As shown in FIG. 3 and FIG. 4, an embodiment of the present disclosure provides a coating apparatus, including a coating chamber 11, and a substrate support structure 12 and a heater 13 provided in the coating chamber 11.

In some embodiments, the substrate support structure 12 includes a plurality of support units 14. The heater 13 includes a heating plate body 17 having a plurality of through holes 16 and heating filling parts 18 each arranged to correspond to one of the plurality of through holes 16. For example, each of the plurality of support units 18 is disposed in one of the plurality of through holes 16. The plurality of support units 14 may be received in the plurality of through holes 16 respectively. As an example, the plurality of through holes 16 may be arranged in one-to-one correspondence to the plurality of support units 14, for example, the plurality of support units 14 are fitted into the plurality of through holes 16 in one-to-one correspondence. In each of the plurality of through holes 16, one of the plurality of support units 14 is arranged between one of the heating filling parts 18 and an inner wall of the through hole 16. In other words, the heating filling parts 18 are located within the plurality of support units 14 respectively. In some embodiments, the heater 13 further includes connection parts 19. Each of the connection part 19 is configured to connect a corresponding one of the heating filling parts 18 with the inner wall of a corresponding one of the through holes 16. That is, the heating filling part 18 is connected with the inner wall of the through hole 16 through the connection part 19. As an example, the support units 14 are slidably fitted into the through holes 16 respectively.

In some embodiments, the coating apparatus may further include a driving device 10. The driving device 10 is used to drive the heater 13 to move in an axial direction of the through holes.

In the coating apparatus provided according to embodiments of the present disclosure, the substrate support structure 12 is used to support a substrate 09. During coating, the driving device 10 drives the heater 13 to move in the axial direction of the through holes, such that the heater 13 is in contact with and heats the substrate 09. As such, the heating plate body 17 and the heating filling parts 18 of the heater 13 may heat the substrate 09 at the same time, thereby improving the non-uniform heating of the substrate 09 during coating and improving the coating quality.

Continuing to refer to FIG. 3 and FIG. 4, the coating apparatus further includes a feed inlet 20 located at a top of the coating chamber 11 and an exhaust port 21 located at a bottom of the coating chamber 11. Before coating, the heater 13 is in an initial position, and the top of the substrate support structure 12 extend out of the through holes 16 of the heating plate body 17, and the substrate 09 is placed by a robot arm on the substrate support structure 12 through, for example, a gap between the substrate support structures 12. During coating, the heater 13 is moved to be in contact with the substrate 09, the heating plate body 17 and the heating filling parts 18 heat the substrate 09 at the same time, mixed gases enter the coating chamber 11 and chemically react on a surface of the heated substrate 09 so as to precipitate and create a film on the surface of the heated substrate 09. After completing coating of the film, the heater 13 is moved to the initial position, and the substrate 09 with the coated film is located on a top end of the substrate support structure 12 and is removed out of the coating apparatus by the robot arm.

Figure 5:
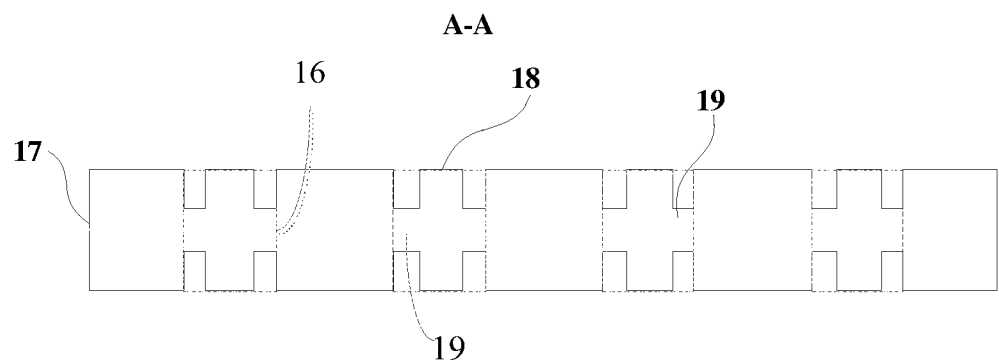
FIG. 5 is a sectional schematic view taken along line A-A in FIG. 4.

As shown in FIG. 5, a surface at a side of the heating plate body 17 facing towards the substrate 09 and surfaces at a side of the heating filling parts 18 facing towards the substrate 09 are located on a same plane. Thereby, it can avoid a height difference between a surface of the heating plate body 17 in contact with the substrate 09 and surfaces of the heating filling parts 18 in contact with the substrate 09. As such, the heating plate body 17 and the heating filling parts 18 are both in contact with and heat the substrate 09, such that the substrate 09 is more uniformly heated during the coating.

Figure 6:
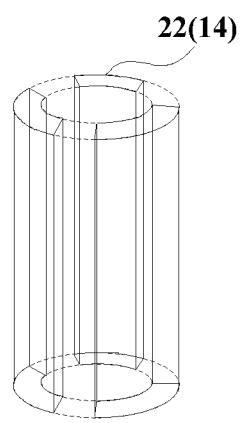
FIG. 6 is a structural schematic diagram of a support structure according to an embodiment of the present disclosure.

As shown in FIG. 6, in some embodiments of the present disclosure, each of the plurality of support units 14 includes at least two support bars 22. The at least two support bars 22 are distributed (for example, may be uniformly distributed, but the present disclosure is not limited to this) in a circumferential direction of the corresponding through hole 16. As shown, each of the plurality of support units 14 includes three support bars 22. In other embodiments of the present disclosure, however, the number of the support bars 22 is not limited to this, it is also possible that each of the plurality of support units 14 may be provided with more than three support bars 22. With this configuration design, the heating filling parts 18 are located within the plurality of support units 14 respectively, such that a contact area between the heater 13 and the substrate 09 is increased, thereby the substrate 09 is more uniformly heated during the coating. In addition, the heating plate body 17 and the heating filling parts 18 heat the support units 14 at the same time, such that inner and outer sides of the support units 14 are heated synchronously, thereby temperature uniformity of the support units 14 is improved, and thus the substrate 09 is more uniformly heated during the coating.

Figure 7:
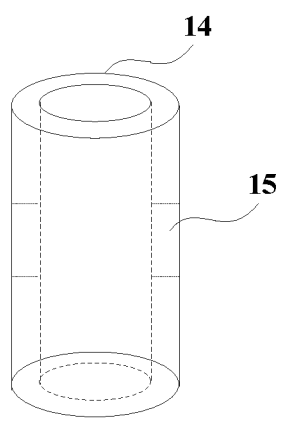
FIG. 7 is a structural schematic diagram of a support structure according to another embodiment of the present disclosure.

As shown in FIG. 7, each of the plurality of support units 14 has a guide groove 15 provided in an axial direction of the through hole, and the connection part 19 is slidably fitted into the guide groove 15. In some embodiments of the present disclosure, each of the plurality of support units 14 is a support cylinder.

In some embodiments of the present disclosure, corresponding to each of the plurality of through holes 16, there are provided at least two connection parts 19, which are uniformly distributed in a circumferential direction of the through hole 16. Each of the plurality of support units 14 is a support cylinder, and a sidewall of the support cylinder 14 is formed with guide grooves 15 into which the at least two connection parts 19 are sidably fitted respectively.

In embodiments of the present disclosure, the specific type of the substrate support structure 12 is not particularly limited, for example, it may be a ceramic substrate support structure or an aluminum substrate support structure.

In embodiments of the present disclosure, the specific type of the heater 13 is not particularly limited, for example, it may be a resistive heater, an infrared heater or a laser heater. In an embodiment of the present disclosure, the heater 13 is a resistive heater. During the coating, a resistive element of the heater 13 is powered and generates heat, and the heating plate body 17 and the heating filling parts 18 are in contact with the substrate 09 so as to heat the substrate 09 through heat transfer.

In embodiments of the present disclosure, a section shape of the heating filling part 18 in a direction perpendicular to the axial direction of the through hole is not particularly limited, for example, may be a circular or polygonal shape.

In embodiments of the present disclosure, the specific type of the driving device 10 is not particularly limited, for example, it may be a stepping motor or a servo motor.

Obviously, various changes and modifications to the present disclosure may be made by those skilled in the art without departing from the principle and spirit of the present disclosure. Thus, if such changes and modifications to the present disclosure fall within the scope of the present application defined by claims and equivalents thereof, the present disclosure is also intended to cover such changes and modifications.

What is claimed is:

1. A coating apparatus, comprising:
   a coating chamber; and
   a substrate support structure and a heater in the coating chamber,
   wherein the substrate support structure comprises a plurality of support members;
   the heater comprises a heating plate body having a plurality of through holes and heating filling parts each provided in each of the plurality of through holes, the plurality of support members being slidably received in the plurality of through holes respectively;
   in each of the plurality of through holes, one of the plurality of support members is hollow in a direction in which the through hole extends and is located between one of the heating filling parts and an inner wall of the through hole accommodating the one of the heating filling parts in a direction perpendicular to the direction which the through hole extends; and
   the heater further comprises connection parts each configured to connect one of the heating filling parts with the inner wall of the through hole accommodating the one of the heating filling parts.

2. The coating apparatus according to claim 1, wherein a surface at a side of the heating plate body facing towards a substrate and surfaces at a side of the heating filling parts facing towards the substrate are on a same plane.

3. The coating apparatus according to claim 1, wherein each of the plurality of support members is a support cylinder.

4. The coating apparatus according to claim 1, wherein each of the plurality of support members comprises at least two support bars, the at least two support bars being distributed in a circumferential direction of the through hole in which the at least two support bars are located.

5. The coating apparatus according to claim 4, wherein the at least two support bars are uniformly distributed in the circumferential direction of the through hole in which the at least two support bars are located.

6. The coating apparatus according to claim 1, wherein each of the plurality of support members has a guide groove provided in an axial direction of the through hole, and a respective connection part is slidably fitted into the guide groove.

7. The coating apparatus according to claim 1, wherein each of the plurality of support members is slidably fitted into a corresponding one of the through holes.

8. The coating apparatus according to claim 1, wherein the plurality of through holes are in one-to-one correspondence to the plurality of support members.

9. The coating apparatus according to claim 1, wherein a section of each of the heating filling parts in a direction perpendicular to an axial direction of the through holes has a circular or polygonal shape.

10. The coating apparatus according to claim 1, further comprising a driving device configured to drive the heater to move in an axial direction of the through holes.

11. The coating apparatus according to claim 10, wherein the driving device comprises a stepping motor or a servo motor.

12. The coating apparatus according to claim 1, wherein the heater includes a resistive heater, an infrared heater or a laser heater.

13. The coating apparatus according to claim 1, wherein the substrate support structure comprises a ceramic substrate support structure or an aluminum substrate support structure.

* * * * *